United States Patent [19]

Schumacher et al.

[11] Patent Number: 5,330,800

[45] Date of Patent: Jul. 19, 1994

[54] HIGH IMPEDANCE PLASMA ION IMPLANTATION METHOD AND APPARATUS

[75] Inventors: Robert W. Schumacher, Woodland Hills; Jesse N. Matossian, Canoga Park; Dan M. Goebel, Tarzana, all of Calif.

[73] Assignee: Hughes Aircraft Company, Los Angeles, Calif.

[21] Appl. No.: 971,433

[22] Filed: Nov. 4, 1992

[51] Int. Cl.$^5$ .............................................. B05D 3/06
[52] U.S. Cl. ................................. 427/523; 427/566; 427/571; 427/569; 427/530; 427/531
[58] Field of Search ............... 427/523, 527, 528, 529, 427/530, 531, 569, 571, 573, 574, 576, 577, 578, 579, 566, 567

[56] References Cited

U.S. PATENT DOCUMENTS

| | | | |
|---|---|---|---|
| 3,479,269 | 11/1969 | Byrnes, Jr. et al. | |
| 3,732,158 | 5/1973 | Przybyszewski et al. | |
| 4,247,804 | 1/1981 | Harvey. | |
| 4,596,945 | 6/1986 | Schumacher et al. | |
| 4,764,394 | 8/1988 | Conrad. | |
| 4,912,367 | 3/1990 | Schumacher et al. | |
| 4,937,205 | 6/1990 | Nakayama et al. | 427/569 |
| 5,015,493 | 5/1991 | Gruen. | |
| 5,019,752 | 5/1981 | Schumacher. | |
| 5,126,163 | 6/1992 | Chan | 427/531 |
| 5,212,425 | 5/1993 | Goebel et al. | 315/111.21 |
| 5,218,179 | 6/1993 | Matossian et al. | 204/298.05 |

OTHER PUBLICATIONS

*Thin Film Processes*, John L. Vossen and Werner Kern, Academic Press, Inc., 1978, pp. 86-87. No month.
Chapman, Glow Discharge Processes-Sputtering and Plasma Etching, John Wiley & Sons, p. 29. No date.
Kwon et al., "A Comparative Study Between Pulsed and D.C. Ion Nitriding Behavior in Specimens with Blind Holes", *Proceedings of the International Conference on Ion Nitriding*, 1987, pp. 77-81. No month.
Liu, "Plasma Production by Beam-Plasma Discharge", Department of Physics, Stevens Institute of Technology, Apr. 1974, pp. 1-2, 87.
"Total and Partial Ionization Cross Sections of Atoms and Ions by Electron Impact", H. Tawara et al., Atomic Data and Nuclear Data Tables, vol. 36, No. 2, Mar. 1987, pp. 167-221.
"Discharge and ion extraction properties of a beam–plasma ion source", Rosing et al., J. Appl. Phys. 57(3), Feb. 1, 1985, pp. 816-818.
Schmidt, *Physics of High Temperature Plasmas* 2d ed., Academic Press, 1979, pp. 220-222. No month.
Ishikawa et al., "Ion beam extraction with ion space–charge compensation in beam-plasma types ion source", *Journal of Applied Physics*, vol. 53, No. 9, Sep. 1982, pp. 6018-6028.
Demirkhanov et al., "Ion Emmission From a Beam–Plasma Discharge", *Soviet Physics-Technical Physics*, vol. 15, No. 7, Jan. 1971, pp. 1047-1050.

*Primary Examiner*—Marianne Padgett
*Attorney, Agent, or Firm*—Vijayalakshmi D. Duraiswamy; Wanda K. Denson-Low

[57] ABSTRACT

A high dose rate, high impedance plasma ion implantation method and apparatus to apply high voltage pulses to a target cathode within an ionization chamber to both sustain a plasma in the gas surrounding the target, and to implant ions from the plasma into the target during at least a portion of each pulse. Operating at voltages in excess of 50 kV that are too high for the reliable formation of a conventional glow discharge, the plasma is instead sustained through a beam-plasma instability interaction between secondary electrons emitted from the target and a background pulsed plasma. The voltage pulses are at least about 50 kV, and preferably 100 kV or more. Pulse durations are preferably less than 8 microseconds, with a frequency in the 50–1,000 Hz range. The preferred gas pressure range is $1 \times 10^{-4}$–$1 \times 10^{-3}$ Torr; auxiliary electrodes can be used at the lower pressures to provide sufficient seed electrons for initiating a plasma, which is sustained by the beam-plasma instability interaction.

18 Claims, 4 Drawing Sheets

HIGH IMPEDANCE PLASMA ION IMPLANTATION METHOD AND APPARATUS

BACKGROUND OF THE INVENTION

1. Field of the Invention

This invention relates to plasma ion implantation, and more particularly to a high voltage implantation method and apparatus in which the plasma is generated with the same pulse-power system that applies a high voltage to the target being implanted.

2. Description of the Related Art

Plasma ion implantation is a process in which irregularly shaped target objects are immersed in a plasma and biased negatively to attract positive ions from the plasma, which impact the targets with sufficient energy to be implanted into them. The intent is to improve the surface properties of the object in areas such as better wear characteristics and increased hardness. Numerous different applications for ion implantation are known; its advantageous uses include the rapid processing of ferrous materials, for the production of industrial tool dies with good wear qualities but at relatively low cost and mass per die.

A high voltage, typically greater than 50 kV, must be applied to the target to provide sufficient acceleration to the plasma ions to achieve a significant implantation depth of 0.1 microns or greater. Previous implantation systems have used independent mechanisms to produce a continuous plasma, and to bias the target. One patent in this area, U.S. Pat. No. 4,764,3949 to Conrad, uses a discharge between a cathode inserted into a plasma chamber and a chamber wall (which functions as an anode) to produce a continuous plasma through volume ionization of the background gas. A separately biased target is inserted into the plasma for ion implantation. The background gas pressure is typically $10^{-5}$–$10^{-4}$ Torr. The plasma envelops all of the surface irregularities of the target object, which is pulse-biased to a high negative potential (on the order of 20–100 kV) with respect to the plasma by a high voltage modulator system that is independent of the plasma production system. The pulse-biasing of the immersed target reduces arcing, limits expansion of the plasma sheath, and achieves an omnidirectional and uniform implantation of plasma ions over the entire target surface. Major disadvantages, however, are that a separate plasma production system is required, and that sustaining the plasma on a continuous basis during the target pulsing results in a high ion surge current during the rise times of the voltage pulses. Furthermore, to achieve high ion doses in a short time period, a very high frequency operation of the target pulse modulator (on the order of 1 kHz) is required, which can lead to arcing. The ion implantation rate could also be increased by increasing the gas pressure above $10^{-4}$ Torr to raise the plasma density, but this can also result in arc formation.

In the Conrad patent the plasma sheath is initially close (a few Debye lengths) to the target surface. Upon application of the implantation voltage pulse, the plasma ions are removed from the plasma and the sheath expands. During the OFF time of the implantation voltage pulse, the plasma sheath moves back toward the surface of the part. In conventional practice, there is an upper limit of frequency ($\sim 1$ kHz) of the implantation voltage pulses above which the plasma sheath is unable to move back in time, to conform to the target surface, before the next pulse is applied. Furthermore, with the plasma present before the implantation voltage pulse is applied, a very high electric field develops ($>50$–$100$ kV/cm) across the plasma sheath once the implantation voltage is applied. A high ion current spike occurs which, together with the high electric field stress, leads to arcing at high repetition rate ($>1$ kHz) and high gas pressure ($>10^{-4}$ Torr).

An alternate plasma production mechanism for plasma ion implantation is disclosed in patent application Ser. No. 07/595,123, filed Oct. 10, 1990 by Matossian and Goebel and assigned to Hughes Aircraft Company, the assignee of the present invention. In this application the plasma is formed in a localized plasma generator attached to the vacuum system, rather than by volume ionization of the background gas inside the ionization chamber. It has the advantage of improved uniformity in the implantation working space, improved selective plasma production from more than one species, the elimination of surface contamination from evaporation or sputtering of the filaments used in the U.S. Pat. No. 4,764,394 approach, and the control of the species mix for diatomic working gases. However, this system still utilizes separate discharge and cathode heater power supplies in addition to the high voltage modulator, requires multiple penetrations of the ion chamber, and uses a continuous plasma production that results in a high surge current during the rise time of the target pulse.

Other ion systems are known that operate at a much lower voltage regime than that discussed so far, generally at less than 1 kV, for coating a target rather than implanting ions into it In one such system, described in U.S. Pat. No. 5,015,493 to Gruen, a glow discharge is used to produce ions in the gas. The ions are then attracted to the target surface with the same voltage signal that was used to create the glow discharge. Negative voltage pulses of between 0.1 and 1 kV are applied to the target, with pulse durations of about 10–100 microseconds at a repetition frequency of about 1–10 kHz. Pulses are used rather than a continuous signal to avoid depletion of plasma near the target surface, arcing, and overheating of the target surface during deposition. A specific gas pressure is not given, although the patent states that it "may be less than 100 Pa" (0.73 Torr).

While the Gruen patent is effective for coating a work piece by an ionized vapor, the principles upon which it operates are not applicable to the much higher voltages required for ion implantation. This is because a glow discharge such as that used in the Gruen patent depends upon direct collisions between secondary electrons emitted from the target, and the surrounding gas atoms to produce the ions necessary to sustain the plasma. At the much higher voltages employed for ion implantation, typically on the order of 50 kV or greater, the secondary electrons have a much longer mean free path and a correspondingly lower probability of making an ionizing collision with a gas atom. Thus, the ion density from secondary electron collisions will be much lower at the higher voltage levels. This is illustrated in H. Tawara and T. Kato, "Total and Partial Ionization Cross Sections of Atoms and Ions by Electron Implant", *Atomic Data and Nuclear Data Table*, Academic Press, Vol. 36, No. 2, March 1987, pages 167–353, in which the ionization cross-sections of the noble gases at energies greater than 20 keV are shown to be on the order of thirty times less than at 100–200 eV; at such low ionization cross sections it would be very difficult to produce and sustain a dense plasma. The drop in ionization would be even greater at 100 keV, at which much ion implantation work is performed.

A pulsed glow discharge has also been used for ion nitriding, in which nitrides are formed at the target surface from an ionized nitrogen gas. This technique is described, for example, in Kwon et al., "A Comparative Study Between Pulsed and D. C. Ion Nitriding Behavior in Specimens with Blind Holes", *Proceedings of the International Conference on Ion Nitriding*, 1987, pages 77-81. In this technique the gas pressure is even higher, on the order of 1-10 Torr, and again the voltage levels employed to establish a glow discharge (typically less than 1 kV) are much lower than those used for ion implantation.

Other pulsed ion systems are also known. In U.S. Pat. No. 3,732,158 to Przybszewski a 2-5 kV DC voltage source is initially connected to an object to establish a glow discharge used to sputter clean the object, followed by lowering the gas pressure to about $10^{-2}$ Torr, pulsing the voltage source and applying RF power to a film material which is sputtered onto the target. In U.S. Pat. No. 3,479,269 to Byrnes, Jr. et al. a sputter etching process is accomplished by applying a negative 1.5 kV pulse train to a target to both form a plasma and to attract ions to the target (see FIG. 5). However, as with the Gruen patent, the systems described in these two patents are not applicable to much higher voltage ion implant techniques.

SUMMARY OF THE INVENTION

The present invention seeks to provide a high dose rate, high impedance plasma ion implantation technique and apparatus that eliminates the need for a separate plasma formation system, is capable of a higher implanted-ion dose rate and avoids the ion surge current of the Conrad patent, and is capable of sustaining a plasma at high ion implantation voltages in excess of 50 kV.

These goals are achieved by applying a negative voltage pulse train to an ion implantation target at a voltage level that is too high for the reliable establishment of a conventional glow discharge plasma. Rather, a pulsed plasma is established around the target by means of a beam-plasma instability interaction for at least a portion of each pulse. This is the same plasma generation mechanism that is used to fill the slow wave structure in the PASOTRON® (trademark of Hughes Aircraft Company) microwave source described in U.S. Pat. No. 4,912,367 by Schumacher et al. and assigned to Hughes Aircraft Company. Although the secondary electrons emitted from the target are generally insufficient to establish a direct glow discharge, they do establish a background pulsed plasma that is used to build up a primary pulsed plasma through the beam-plasma instability interaction between the secondary electrons and the background plasma. The plasma is produced as a result of the application of the voltage pulses to the target, such that an ion current surge at the beginning of each voltage pulse is inhibited.

The new implantation method enables targets to be implanted at significantly higher doses in shorter time periods. The preferred operating parameters are a voltage level in excess of 50 kV and preferably in excess of 100 kV, pulse durations of less than about 10 microseconds with a frequency in the 50-1,000 pulses per second range, and a gas pressure of about $1 \times 10^{-4} - 1 \times 10^{-3}$ Torr. At the lower pressures, one or more auxiliary electrodes can be placed within the ion chamber. Upon application of target pulses, seed electrons which initiate the beam plasma discharge are produced by the auxiliary electrode. The target pulses also sustain the plasma through the beam-plasma instability interaction. At the higher pressures no auxiliary electrodes are required but they may still be used to help control and adjust plasma conditions.

Further features and advantages of the invention will be apparent to those skilled in the art from the following detailed description, taken together with the accompanying drawings.

DETAILED DESCRIPTION OF THE INVENTION

Figure 1:
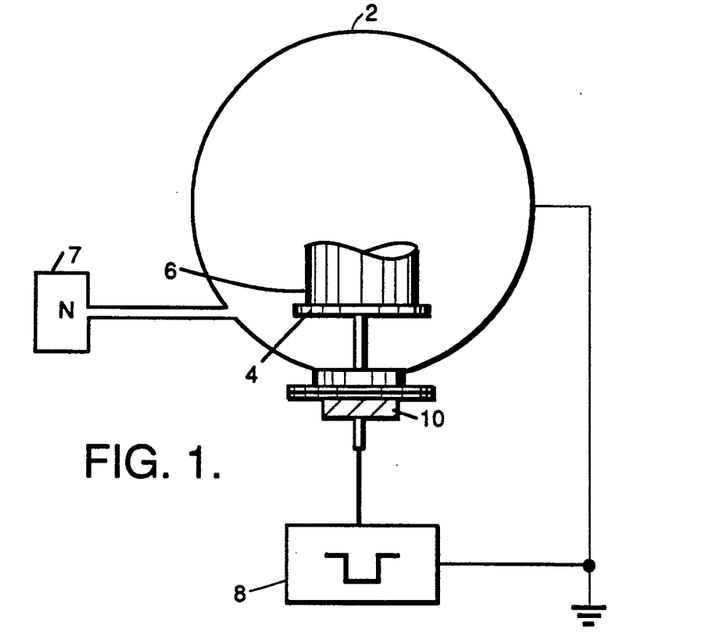
FIG. 1 is a simplified elevation view of a pulsed ion implantation system that can be used to practice the method of the invention.

A simplified view of a plasma ion implantation system that can be used to practice the method of the present invention is given in FIG. 1. It consists of a sealed plasma chamber 2, with a platform 4 supported inside the chamber to support a target object 6 into which ions are to be implanted. A gas such as nitrogen is introduced into the chamber from a gas source 7. The chamber and target support structures are not of conventional design and will be described in detail later.

The output of a high voltage pulse generator 8 is connected through an insulated vacuum feedthrough 10 to the target 6, which is elevated to the same voltage potential as the output of source 8. A ground reference is provided for both the voltage source 8 and the walls of chamber 2. A fast high voltage switch is necessary to form the pulses. The CROSSATRON® switch described in U.S. Pat. Nos. 4,247,804 to Harvey, U.S. Pat. No. 4,596,945 to Schumacher and Harvey and U.S. Pat. No. 5,019,752 to Schumacher, all assigned to Hughes Aircraft Company, is suitable for this purpose.

The voltage pulses supplied from source 8 to the target 6 are high enough for ion implantation, generally in excess of 50 kV and preferably at least 100 kV. As described above, in this voltage regime it is very doubtful that a conventional glow discharge could be established around the target, and a plasma formation system that is separate from the target voltage source would normally be used. However, it has been discovered that a plasma can be sustained at these high voltage levels through a mechanism that is quite different from the normal glow discharge. This plasma generating mechanism is referred to as a beam-plasma instability interaction, and has heretofore been observed only in connection with electron beams. This form of plasma production is described in a thesis by Liu, "Plasma Production By Beam-Plasma Discharge", Stevens Institute of Technology, 1974, pages 1-2; in Schmidt, *Physics of High Temperature Plasmas 2d ed.*, Academic Press, 1979, pages 220-222; in Ishikawa et al, "Ion beam extraction with ion space-charge compensation in beam-plasma type ion source", *Journal of Applied Physics*, Vol. 53, No. 9, September 1982, pages 6018-6028; in Rosing et al, "Discharge and ion extraction properties of a beam-plasma ion source", *Journal of Applied Physics*, Vol. 57, No. 3, Feb. 1, 1985, pages 816-818; and in Demirkhanov et al, "Ion Emission From a Beam-Plasma Discharge", *Soviet Physics-Technical Physics*, Vol 15, No. 7, January 1971, pages 1047-1050.

In this process the electrons that leave a cathode are accelerated by an applied voltage and make ionizing collisions with surrounding gas atoms. However, the background plasma produced by these primary electrons is very tenuous, since they are relatively few in number and their mean free paths are much longer than the length of the discharge chamber. The resulting mixture of primary electrons (the electron beam) and background plasma is unstable with respect to density fluctuations. Due to this beam-plasma interaction, strong high frequency plasma waves are excited in the plasma. These waves heat the background plasma electrons, and the tail of the resulting electron velocity distribution ionizes the fill gas to increase the plasma density to levels much higher than one would calculate based upon the ionization rate of the original high energy electron beam. The plasma density gradually increases, and the primary plasma density reaches a steady state value at which the beam-plasma, plasma production is balanced by particle losses to the chamber walls. Various types of electron beam guns have been employed to provide the beam which initiates the plasma production, including the hollow cathode plasma E-gun described in U.S. Pat. No. 4,912,367.

In the present invention, rather than employing a one-dimensional electron beam gun, the entire exposed surface of the implantation target in effect serves as the electron source, and the electron beam becomes a 3-dimensional distribution of secondary electrons flowing into the background gas. However, it has been discovered that the same type of beam-plasma instability interaction occurs as with an electron beam. This distinct plasma generation mechanism is used instead of a conventional glow discharge to establish a pulsed plasma around the implantation target 6 at the high voltage levels (50-100 kV) required for ion implantation.

With voltage pulses on the order of 100 kV and currents on the order of 50-500 A, a high impedance on the order of 2 Kohm-0.2 Kohm can be sustained across the plasma sheath that surrounds the target surface during each pulse. The pulse duration must be long enough to allow sufficient time to establish plasma in the working chamber via the beam-plasma instability mechanism. The pulse duration must also be short enough to prevent excessive movement of the plasma sheath away from the target surface during implantation, which could otherwise result in the plasma sheath being unable to conform to small features of the target surface. This requirement is distinct from the previous Conrad patent technique, in which the plasma sheath is established around the target surface prior to the application of the implantation voltage pulse. The pulse duration then determines the amount of sheath expansion that will occur. During the pulse-OFF time, the plasma sheath moves back in toward the target surface and establishes its previous position before the next voltage pulse is applied.

In the present invention, there is no plasma or plasma sheath established prior to the application of the implantation voltage pulse. Once the voltage pulse is applied, plasma is formed via the beam-plasma instability, and a plasma sheath is established that moves in toward the target surface during the pulse duration. As the plasma density increases the sheath conforms to the target surface, and then moves away from the target surface as ions are depleted from the plasma during the implantation process. Therefore, in the present invention the pulse duration must be long enough to allow sufficient time to establish plasma in the working chamber via the beam-plasma instability mechanism, but short enough to prevent excessive movement of the plasma sheath away from the target surface during implantation. To satisfy these simultaneous requirements, the pulse duration should be longer than 1 microsecond. In the preferred embodiment a pulse duration of 7-8 microseconds is used; longer pulse durations result in arcing across the plasma sheath between the target surface and the plasma. The pulse repetition frequency should generally be kept between 50-1,000 Hz. Successful operation has been sustained with pulse durations of about 5 microseconds, and a pulse frequency in the range of 80-200 Hz.

The gas pressure within the chamber is another important parameter for the implantation process. Increasing the pressure causes the plasma density to rise, and this yields a more rapid implantation of ions. However, arcing can occur if the pressure is too high. It has been found that, with 100 kV pulses, arcing can occur at pressures above about $5 \times 10^{-3}$ Torr. A lower limit to the permissible pressure range is established by the minimum pressure at which a pulsed high impedance discharge plasma can be sustained. Suitable plasmas are achievable at gas pressures down to about $1 \times 10^{-4}$ Torr, although at such pressures an auxiliary electrode (described below) is generally required to initiate each plasma pulse.

An important advantage of the present invention is that it is capable of achieving much higher plasma densities, and thus faster implantation rates, than the Conrad patent. The ion dose rate per pulse achievable with the Conrad patent is generally on the order of one milliamp per square centimeter, as opposed to dose rates greater than 10 milliamperes per square centimeter with this invention. This high current density allows the sheath thickness to be small, on the order of 3-6 cm even at 50-100 kV. According to the Conrad patent, the presence of a plasma is needed before the application of the high voltage pulse, so that a small sheath is established to enable the implantation of fine features on the target. With the present high impedance technique, the ion current density is so high that adequately small sheaths are obtained even at 100 kV.

Figure 2:
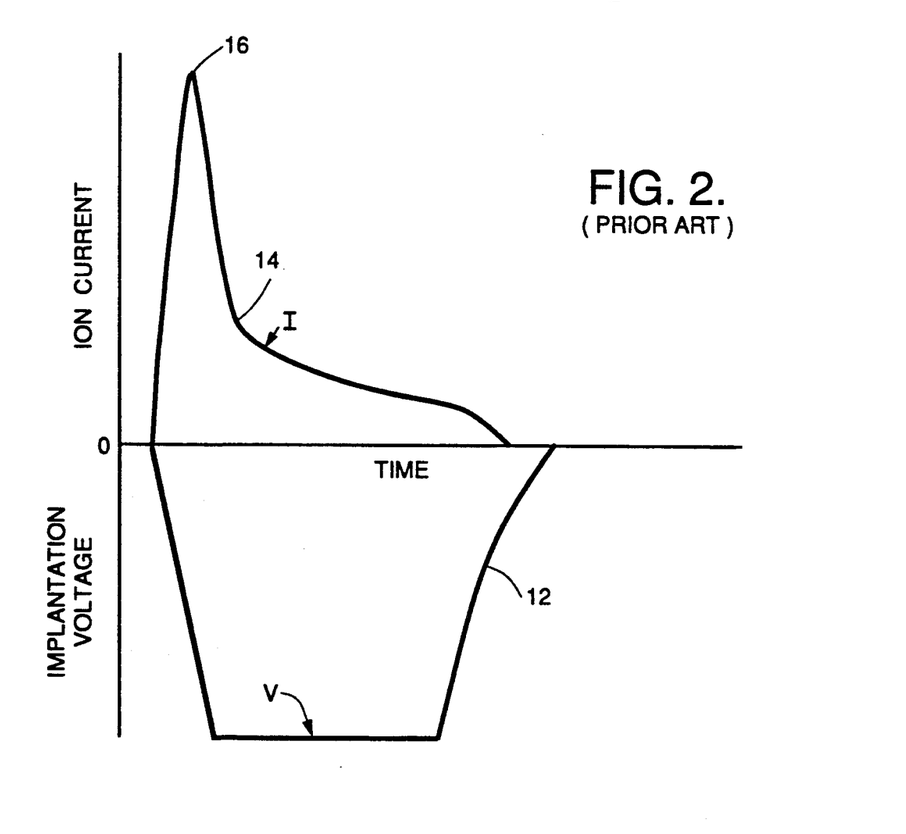
FIG. 2 is a graph illustrating the voltage and ion current responses of a pulsed target, continuous plasma system such as that described in the Conrad patent.

Another significant improvement over the Conrad process that is offered by the invention is that an ion surge current encountered at the beginning of each high voltage pulse applied to the target can be virtually eliminated. The Conrad situation is illustrated in FIG. 2, in which a voltage pulse 12 applied to the target is plotted on the same time scale as the resulting ion current 14 implanted from the plasma into the target. With the continuous plasma of Conrad, the highest ion current is delivered to the target during the voltage rise time. This produces a high current spike 16, which results from two contributions. The first contribution is from the charging of the large system capacitance (cable, feedthrough, target table, etc.). The second contribution is from the large flux of ions flowing onto the target when the applied high voltage establishes the Child-Langmuir sheath between the target and the plasma by sweeping out the charge (ions) as the sheath expands. The current rises to 2-10 times its equilibrium value while the voltage is rising. The large current spike requires a significant surge current capability by the high voltage modulator, and places undue stress on the modulator circuit.

Figure 3A:
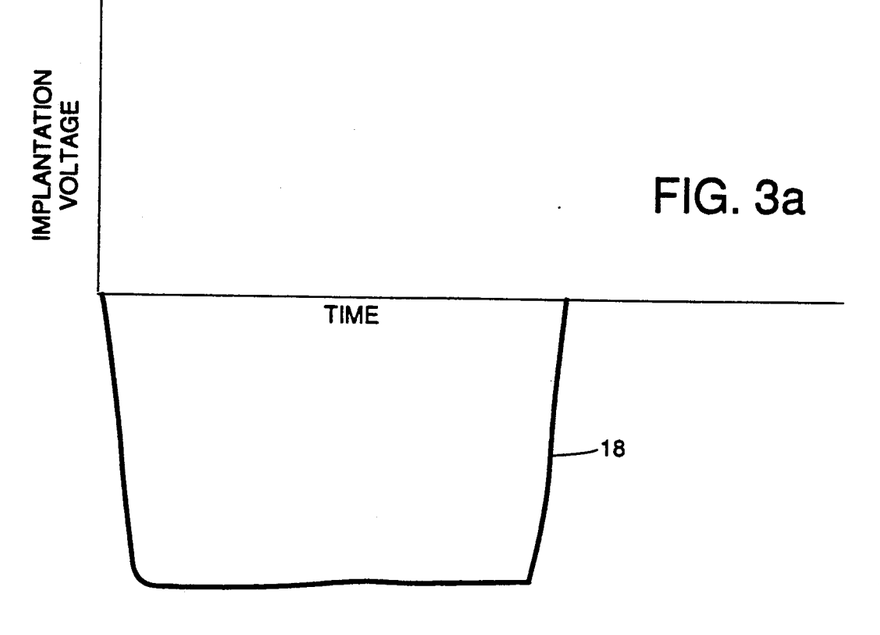
FIGS. 3a, 3b and 3c are graphs respectively illustrating voltage, plasma density and ion current responses achieved with the present invention.
Figure 3B:
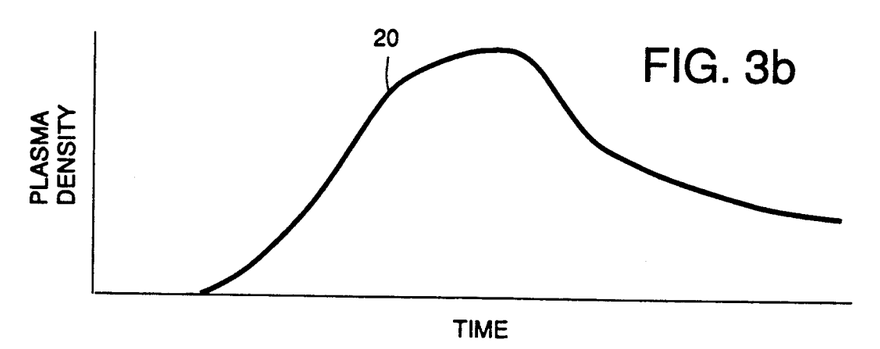
Figure 3C:
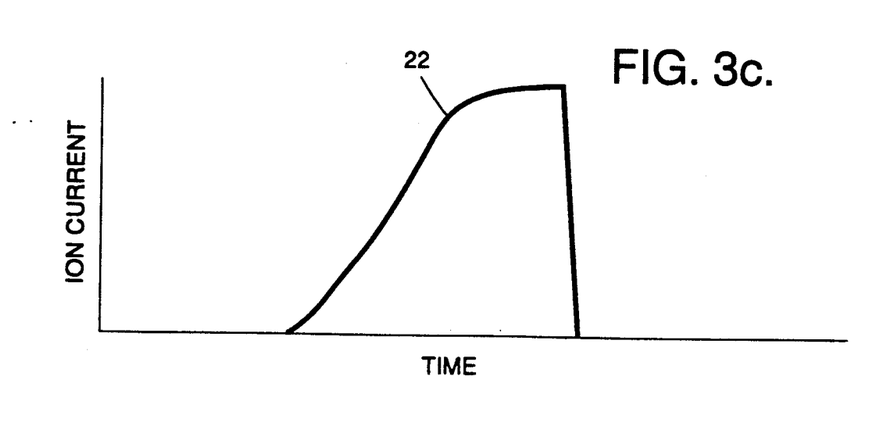

With the present invention, by contrast, the plasma and high voltage pulses are created simultaneously from a single modulator. The voltage pulse rises faster than the plasma density due to the finite time required to generate the plasma, fill the working volume with plasma, and transport the ions to the target. The ion current to the target rises slower than the voltage pulse, resulting in ion implantation at full voltage during the current rise time. The situation is illustrated in FIGS. 3a, 3b and 3c, in which curves 18, 20 and 22 respectively indicate the implantation voltage, plasma density and ion current waveforms plotted against a common time scale. It can be seen that the rise in both the plasma density and in the ion current lag behind the voltage rise, and do not reach peak values until the peak voltage has already been established.

The slower ion current rise time provided by the invention gives a "soft start" to the current pulse that reduces the target's arcing rate. Also, this pulse shape can be more easily coupled to step-up transformers to increase the implantation voltage without exciting high frequency oscillations in the voltage pulse applied to the target. This is in contrast to the high current turn-on spike characteristic of the Conrad continuous plasma approach, which tends to ring pulse transformers and to produce significant oscillations in the implantation voltage output during the pulse. The result with the continuous plasma technique is an implantation voltage that is typically lower than the modulator's peak voltage during some large portion of the pulse, accompanied by shallow ion implantation. The improved current pulse 22 illustrated in FIG. 3c provides both good coupling to a pulse transformer and stable output voltages over the entire pulse length.

Figure 4:
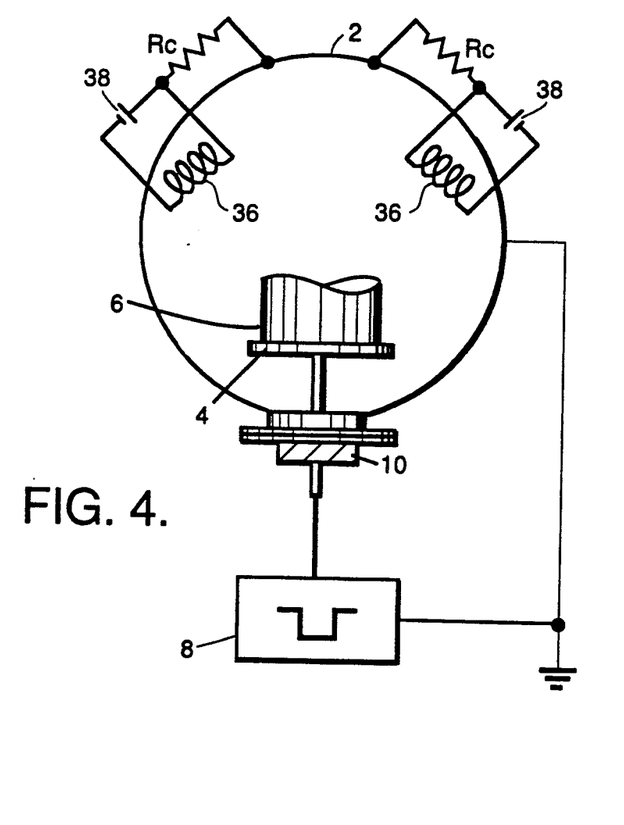
FIG. 4 is a simplified sectional view of another embodiment of the invention, in which auxiliary electrodes are employed.

As mentioned previously, the pulsed plasma system shown in FIG. 1 may not be capable of initiating a plasma at the lower end of the $1 \times 10^{-4}$–$1 \times 10^{-3}$ Torr pressure range. A modified system that allows for this is shown in FIG. 4. In FIG. 1, as the gas pressure is reduced to the range of $1 \times 10^{-4}$ Torr it becomes increasingly difficult to initiate the beam-plasma discharge. This is because the density of background gas atoms is low, and there are few seed electrons present that are required to produce a tenuous plasma that then leads to dense plasma production via the beam-plasma instability. There are two techniques that can be used to alleviate this problem and provide sufficient seed electrons. Both techniques involve the use of auxiliary electrodes placed in the ion implantation chamber to provide the required seed electrons. In one technique, thermionic filaments are used as continuously operating auxiliary electrodes as a source of seed electrons. In the other technique, use is made of magnetically augmented metal plates that serve as cold cathode auxiliary electrodes to provide seed electrons for initiating the beam-plasma-discharge process at low pressure.

FIG. 4 is a diagram of the first embodiment to aid in operation at low background pressures. It consists of placing one or more electron-emitting filaments inside the ionization chamber 2. The filaments 36 are referenced at one end to the vacuum chamber wall, either by using resistors Rc as shown, or by connecting them directly to the wall. The filaments 36 are heated to thermionic temperatures using the power supplies 38, to cause electron emission. No separate plasma is created using these filaments. They merely serve to continuously supply seed electrons to the ion implantation volume. Once the implantation voltage is applied, the seed electrons from the filaments cause sufficient low-level ionization of the background gas so that the beam-plasma discharge process can be initiated at pressures in the lower range of $1 \times 10^{-4}$ Torr. By varying the temperature of the filaments, the plasma density, and therefore the ion current density implanted into the target, can be varied and controlled, independent of the gas pressure and the applied voltage. Although it is primarily intended for allowing operation at low pressure ranges, this embodiment can also be used at the high pressure range described previously.

Figure 5:
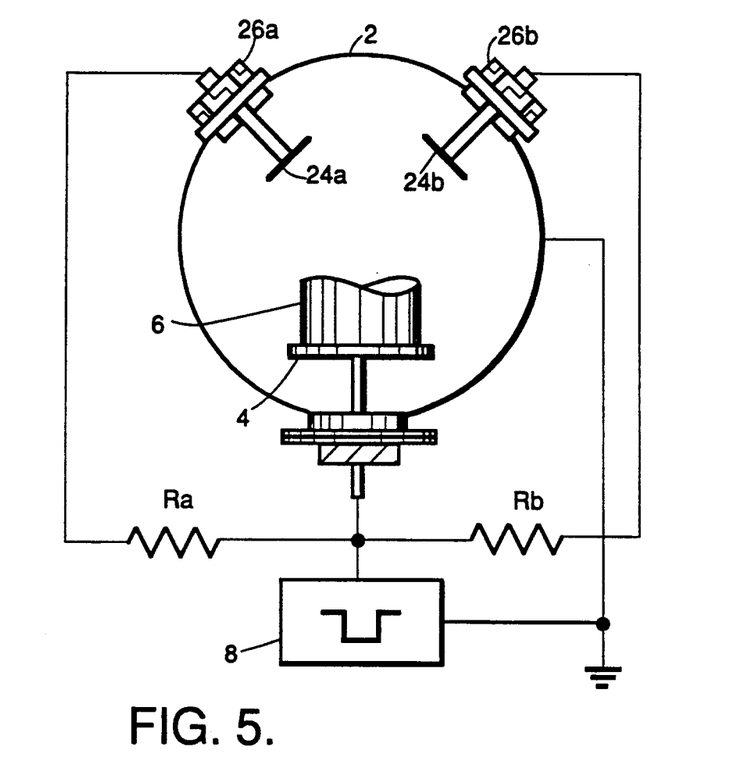
FIG. 5 is a simplified elevation view of another embodiment of the invention with auxiliary electrode arrangements which are different from the arrangement shown in FIG. 4.
Figure 6:
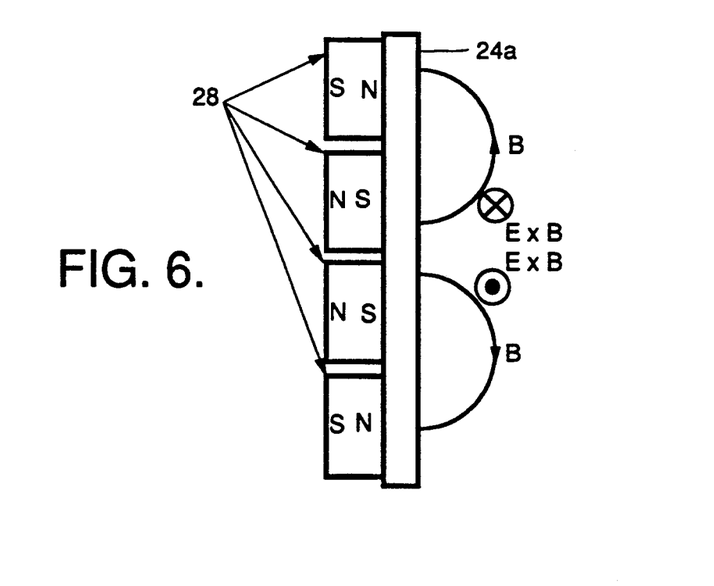
FIG. 6 is a simplified elevation view of an auxiliary electrode structure with magnetic enhancement.

FIG. 5 shows the second embodiment that can be used to aid in beam-plasma discharge operation at low background pressures. This embodiment replaces the hot filament cathodes 36 (and their associated filament heater power supplies 38) with a simple cold cathode system. It consists of one or more metal electrode structures referred to as auxiliary cathodes 24a and 24b that are suspended in the vacuum chamber 2 through feedthroughs 26a and 26b respectively. The cathodes 24a and 24b receive signals from the high voltage pulse generator 8 and are referenced to the target through ballast resistors Ra and Rb. To provide a mechanism to start the discharge on the cold-cathode surface, a localized magnetic field is introduced to the auxiliary cathode structure by means of permanent magnets 28 (as shown in FIG. 6) on the side of the cathode away from the implantation target. This localized magnetic field increases the path length of any electrons emitted from the cold cathode surface; such a discharge can be initiated on the auxiliary cathode at a reduced pressure ($\leq 10^{-3}$ microns). The geometry of the magnetic field at the auxiliary cathode is such that an ExB discharge runs on the cathode. The crossed-field plasma production discharge looks similar to that found in a planar magnetron. The plasma discharge is produced locally at the auxiliary cathodes when the high-voltage pulse is initiated, and ion and electrons diffuse to the target region to aid in the plasma build up.

There are several advantages to utilizing a cold cathode technique (as opposed to a hot filament technique) for the auxiliary cathode configuration shown in FIG. 5. First, the filament heater power supply, which would have to float at the high voltage at the start of the pulse, can be eliminated. Second, the ExB discharge initiates before the high-impedance discharge in the main chamber because of the longer path length of the electrons. This provides control over the introduction of the seed electrons to prevent arcing of the target by improper plasma location and generation. Third, the ExB auxiliary cathode can be used to produce a significant amount of plasma, depending upon the value of the ballast resistor, which can be utilized to control the plasma uniformity on the target. Finally, the material of the auxiliary cathode can be selected to minimize contamination of the substrate by picking a low sputtering yield material (such as molybdenum or tungsten) or, alternatively, a cathode material can be picked that aids in the formation of thin films on the target object by providing simultaneous sputter deposition and ion implantation. An example might be a Ti cathode material to produce TiN on the surface of the target object due to ion implantation of the deposited Ti with nitrogen ions.

An important distinction between the present invention and the prior art exemplified by the Conrad patent should be noted here. As mentioned before, in the prior art it is not possible to simply increase the background gas pressure to achieve a higher ion current and ion dose rate. The reason for this is that the applied implantation voltage pulse is applied in the presence of a previously established plasma that resides closely (a few Debye lengths) to the target surface. This causes a large electric field ($>50$–$100$ kV/cm) to develop rapidly at the sheath at the same time that the ion current spike develops. These conditions can lead to arcing at pressures in excess of $10^{-4}$ Torr, and can prevent stable operation. In contrast, with the present invention no plasma is established prior to application of the implantation voltage. When the voltage pulse is applied in the present invention, a low (1 kV/cm) electric field develops between the target and the vacuum chamber walls in the absence of plasma, and then builds slowly to the same high value experienced in the Conrad technique. At high gas pressure in excess of $10^{-4}$ Torr, a glow discharge is produced via the previously described beam-plasma interaction. With the initial electric field stress reduced and with the ion current spike eliminated at the beginning of the applied pulse, stable operation is achieved at high gas pressure greater than $10^{-4}$ Torr which would otherwise be impossible to achieve with the prior Conrad technique.

The pulsed plasma created with the invention is characterized by a high impedance of between 2 kohms and 0.2 kohms between the target cathode and chamber wall anode, in the sense that a high voltage drop is sustained at the target relative to the plasma. Nearly all of the applied voltage appears across the discharge in the cathode sheath, rather than across a current limiting resistor in the external circuit.

To conduct the high-impedance beam-plasma-discharge process, the apparatus shown schematically in FIG. 1 should preferably adhere to optimum design requirements. The first design requirement concerns the distance between the target support structure 4 and the vacuum chamber walls, both in the upper and lower hemispheres of the vacuum chamber 2 shown in FIG. 1. When a target 6 is placed on the target support structure 4, the beam-plasma discharge process is initiated and sustained between the target surface and the vacuum chamber walls 2, rather than between the bottom of the target support structure and the vacuum chamber walls 2. To ensure this, the distance between the surface of the target 6 and the upper hemisphere of the vacuum chamber 2 should be sufficiently greater (at least a factor of 2 times greater) than the corresponding distance below the target support structure. This design requirement is distinct and different from the prior art of Conrad, which poses no such requirement on the location of the target support structure with respect to the vacuum chamber walls.

An additional consideration is the design of the target support structure itself. In the preferred embodiment, the target support structure should be dimensioned to leave a gap of about 3 to 4 inches between the edges of the support structure and the adjacent vacuum chamber walls, as suggested in FIG. 1. This gap is small enough to prevent a glow discharge from being created in the gap, while at the same time is large enough to prevent unwanted arcing between the support structure and the chamber walls. In addition, the gap size should be small enough to inhibit plasma, created by the glow discharge above the table 4, from leaking around the table and flowing under the support structure to cause initiation of a glow discharge in that region. In this manner, the target support structure simultaneously performs multiple tasks not previously taught by the prior art Conrad technique. It (a) supports the target 6 to be implanted, and (b) also shields the plasma from flowing beneath it. This is in contrast to conventional target support structures, which consist of a single metal electrode to support the target and which allow plasma to flow around it. The target support structure has not previously been used as a device to limit the flow of plasma to various locations in the ion implantation chamber.

An additional system design consideration that is not required, but has been found to be advantageous because of its simplicity, is the absence of magnetic confinement in the main chamber 2 shown in FIG. 1. Because of the use of high pressures in the present invention, magnetic fields are not required. Magnetic fields are typically required in conventional techniques, such as those taught by Conrad, to improve the efficiency of the ionization process for operation at low pressures ($10^{-5}$–$10^{-4}$ Torr). Since the present invention intentionally deals with a higher pressure plasma process, there is no requirement for the use of magnets at the perimeter of the vacuum chamber.

EXAMPLES

In one demonstration which used a filament as an auxiliary electrode, several samples of 304 stainless steel were used as an implantation target with nitrogen gas at a pressure of $5 \times 10^{-4}$ Torr The pulsed implantation voltage was 60 kV, applied at a pulse rate of 500 Hz and a pulsed nitrogen ion current density of 4 mA/cm$^2$. The samples were analyzed for a nitrogen profile with the use of a secondary ion mass spectrometer, which verified that nitrogen ions were implanted to a dose of $4 \times 10^{16}$/cm$^2$ and to a depth of 0.1 micron. Another demonstration was accomplished without auxiliary electrodes. A 50–60 kV implantation voltage and a pressure of $1 \times 10^{-3}$ Torr of nitrogen were used. The pulse repetition rate was 80 Hz, with a pulse length of 5 microseconds. In one hour an implanted dose of $1 \times 10^{16}$/cm$^2$ was achieved with a pulsed current density of 10 mA/cm$^2$. This is contrasted with an implant voltage of 50 kV at the same repetition rate and pulse length in the continuous plasma Conrad system in which the pulsed current density is much lower (on the order of 1 mA/cm$^2$); after operating for one hour at this dose rate the implant dose was less than $10^{15}$/cm$^2$.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A plasma ion implantation method, comprising: providing a target object within a plasma chamber, introducing an ionizable gas into the chamber, and
applying a series of time-spaced negative voltage pulses to the target at a voltage level high enough to (a) induce a 3-dimensional beam of secondary electrons from the target that sustains a plasma in the gas through a beam-plasma instability interaction for at least a first portion of each pulse, and to (b) implant ions from the plasma into the target during at least a second portion of each pulse, wherein said voltage pulses are applied to the target with a rise time rapid enough for the rise in plasma density and implant current during each pulse to lag behind the voltage pulse rise.

2. The method of claim 1, wherein said ionizable gas introduced into said chamber establishes a gas pressure within said chamber of approximately $1\times10^{-3}$–$1\times10^{-3}$ Torr.

3. The method of claim 1, further comprising the step of energizing an auxiliary electrode within said chamber to aid in initiating said plasma with seed electrons emitted from said auxiliary electrode, with said voltage pulses sustaining said plasma through said beam-plasma instability interaction.

4. The method of claim 3, wherein said ionizable gas introduced into said chamber establishes a gas pressure within said chamber less than $1\times10^{-3}$ Torr.

5. The method of claim 3, wherein said auxiliary electrode comprises a cold cathode suspended in said chamber.

6. The method of claim 3, further comprising the step of establishing a localized magnetic field in the vicinity of said auxiliary electrode to restrict a plasma-initiating Paschen breakdown to said auxiliary cathode.

7. The method of claim 3, wherein said auxiliary electrode is provided as an electron emitting filament, and an auxiliary energizing voltage is applied to said filament to energize it to thermionic temperatures to provide seed electrons.

8. The method of claim 7, wherein said ionizable gas introduced into said chamber establishes a gas pressure within said chamber, and the temperature of said filament controls ion current density independent of said gas pressure and voltage pulses.

9. A plasma ion implantation method, comprising:
providing a target object within a plasma chamber,
introducing an ionizable gas into the chamber, and
applying a series of time-spaced negative voltage pulses to the target at a voltage level of at least about 50 kV to (a) induce a 3-dimensional beam of secondary electrons from the target that sustains a plasma in the gas through a beam-plasma instability interaction for at least a first portion of each pulse, and to (b) implant ions from the plasma into the target during at least a second portion of each pulse.

10. The method of claim 9, wherein said pulses have durations less than about 8 microseconds.

11. The method of claim 10, wherein said voltage pulses are applied at a frequency of approximately 50–1,000 pulses per second.

12. The method of claim 11, wherein said pulse duration is on the order of about 5 microseconds and said pulse frequency is within the approximate range of 100–200 pulses per second.

13. A plasma ion implantation method, comprising:
providing a target object within a plasma chamber,
introducing an ionizable gas into the chamber, and
electrically energizing said target with an energization signal that undergoes a signal rise to (a) emit secondary electrons which forms a 3-dimensional beam that establishes a background plasma in said gas in the vicinity of the target through electron-gas collisions, and a primary pulsed plasma in the vicinity of the target through a beam-plasma instability interaction between said 3-dimensional secondary electron beam and said background plasma, and to (b) produce an implantation of ions from said primary plasma into said target, with said plasma experiencing a rise in density under said beam-plasma instability interaction, and said ion implantation experiencing a rise in implantation rate, that lag said signal rise.

14. A plasma ion implantation method, comprising:
providing a target object within a plasma chamber,
introducing an ionizable gas into the chamber, and
electrically energizing said target is energized with negative voltage pulses of at least about 50 kV to (a) emit secondary electrons which forms a 3-dimensional beam that establishes a background plasma in said gas in the vicinity of the target through electron-gas collisions, and a primary pulsed plasma in the vicinity of the target through a beam-plasma instability interaction between said 3-dimensional secondary electron beam and said background plasma, and to (b) produce a pulsed implantation of ions from said primary plasma into said target.

15. The method of claim 14, wherein said pulses have durations less than about 8 microseconds.

16. The method of claim 15, wherein said voltage pulses are applied at a frequency of approximately 50–1,000 pulses per second.

17. The method of claim 14, wherein said ionizable gas introduced into said chamber establishes a gas pressure within said chamber of approximately $1\times10^{-4}$–$1\times10^{-3}$ Torr.

18. The method of claim 14, wherein said voltage pulses are applied to the target with a rise time rapid enough for the rise in plasma density and implant current during each pulse to lag behind the voltage pulse rise.

* * * * *